(12) United States Patent
Kitagawa et al.

(10) Patent No.: US 11,605,421 B2
(45) Date of Patent: Mar. 14, 2023

(54) SEMICONDUCTOR DEVICE HAVING DRIVER CIRCUITS AND SENSE AMPLIFIERS

(71) Applicant: MICRON TECHNOLOGY, INC., Boise, ID (US)

(72) Inventors: Katsuhiro Kitagawa, Hachioji (JP); Toru Ishikawa, Sagamihara (JP); Minari Arai, Niiza (JP); Nobuki Takahashi, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/932,567

(22) Filed: Jul. 17, 2020

(65) Prior Publication Data

US 2022/0020422 A1 Jan. 20, 2022

(51) Int. Cl.

| G11C 7/12 | (2006.01) |
|---|---|
| G11C 11/4091 | (2006.01) |
| G11C 11/4096 | (2006.01) |
| G11C 11/4074 | (2006.01) |
| G11C 11/4076 | (2006.01) |
| G11C 7/06 | (2006.01) |
| G11C 7/10 | (2006.01) |
| G11C 8/08 | (2006.01) |

(52) U.S. Cl.
CPC ......... *G11C 11/4091* (2013.01); *G11C 7/065* (2013.01); *G11C 7/106* (2013.01); *G11C 7/1087* (2013.01); *G11C 7/12* (2013.01); *G11C 8/08* (2013.01); *G11C 11/4074* (2013.01); *G11C 11/4076* (2013.01); *G11C 11/4096* (2013.01); *G11C 2207/005* (2013.01)

(58) Field of Classification Search
CPC ............ G11C 11/4091; G11C 11/4074; G11C 11/4096
See application file for complete search history.

(56) References Cited

U.S. PATENT DOCUMENTS

| 5,295,100 A * | 3/1994 | Starkweather ...... G11C 11/4094 365/189.11 |
|---|---|---|
| 6,418,067 B1 * | 7/2002 | Watanabe ............. G11C 29/78 365/200 |
| 7,929,367 B2 * | 4/2011 | Yoo ......................... G11C 8/08 365/207 |
| 2002/0018394 A1 * | 2/2002 | Takahashi ............... G11C 7/22 365/230.03 |

(Continued)

*Primary Examiner* — Mushfique Siddique
(74) *Attorney, Agent, or Firm* — Dorsey & Whitney LLP

(57) ABSTRACT

Disclosed herein is an apparatus that includes first and second digit lines, a sense amplifier configured to amplify a potential difference between the first and second digit lines, a driver circuit configured to drive each of the first and second digit lines to different one of first and second logic levels from each other, a first transistor coupled between the driver circuit and the first digit line, a second transistor coupled between the driver circuit and the second digit line, and a control circuit configured to supply a first potential to control electrodes of the first and second transistors in response to a write command, and supply a second potential different from the first potential to the control electrodes of the first and second transistors in response to a read command.

14 Claims, 5 Drawing Sheets

(56) References Cited

U.S. PATENT DOCUMENTS

| | | | |
|---|---|---|---|
| 2002/0094626 A1* | 7/2002 | Park | G11C 11/4091 438/200 |
| 2004/0190326 A1* | 9/2004 | Shigenami | G11C 11/40603 365/146 |
| 2009/0021995 A1* | 1/2009 | Oh | G11C 11/4076 365/189.16 |
| 2011/0292709 A1* | 12/2011 | Takayama | G11C 11/4091 365/72 |
| 2013/0193507 A1* | 8/2013 | Yoshida | H01L 21/823487 257/329 |
| 2020/0098402 A1* | 3/2020 | Miyatake | G11C 7/12 |
| 2021/0272620 A1* | 9/2021 | Barry | G11C 11/40618 |

* cited by examiner

SEMICONDUCTOR DEVICE HAVING DRIVER CIRCUITS AND SENSE AMPLIFIERS

BACKGROUND

In general dynamic random access memories (DRAMs), an ACT command and a READ command are issued in this order when a read operation is to be performed, and an ACT command and a WRITE command are issued in this order when a write operation is to be performed. Therefore, at a time when an ACT command has been issued, whether to perform a read operation or a write operation is undetermined. On the other hand, US 2011/0007593 A1 discloses a memory device that can issue a READ command or a WRITE command in an IDLE state. In this type of memory device, whether to perform a read operation or a write operation is determined according to a command issued in the IDLE state.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
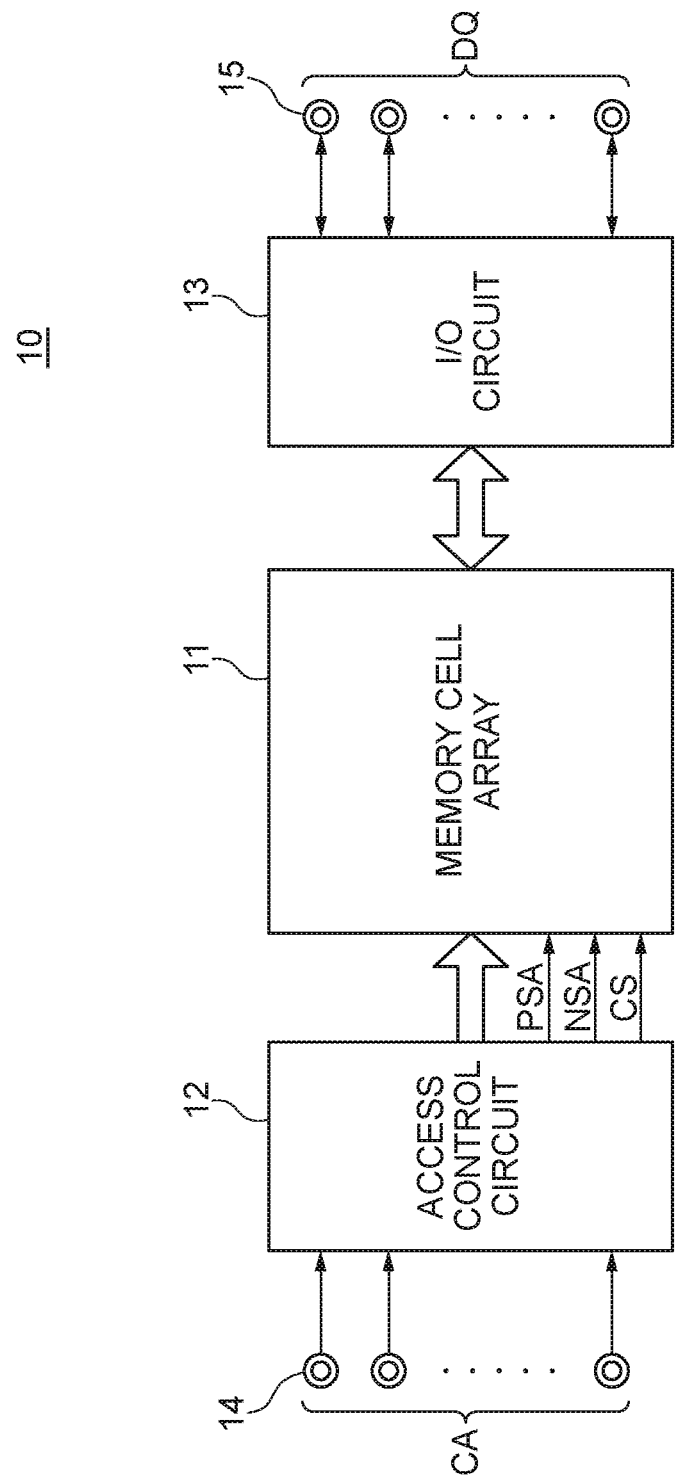
FIG. 1 is a block diagram showing a configuration of a semiconductor device according to the present disclosure.

A semiconductor device 10 shown in FIG. 1 is, for example, a DRAM and includes a memory cell array 11, an access control circuit 12 that performs an access to the memory cell array 11, and an I/O circuit 13 that performs input/output of data to/from the memory cell array 11. The access control circuit 12 performs an access to the memory cell array 11 on the basis of a command address signal CA input from an external controller via a command address terminal 14. The access control circuit 12 includes control and timing circuits and logic that provide column select signals CS to column switches and further provide sense signals PSA and NSA to sense amplifiers of the memory cell array 11. At the time of a read operation, data DQ read from the memory cell array 11 is output to a data terminal 15 via the I/O circuit 13. At the time of a write operation, data DQ input to the data terminal 15 from an external controller is supplied to the memory cell array 11 via the I/O circuit 13.

Figure 2:
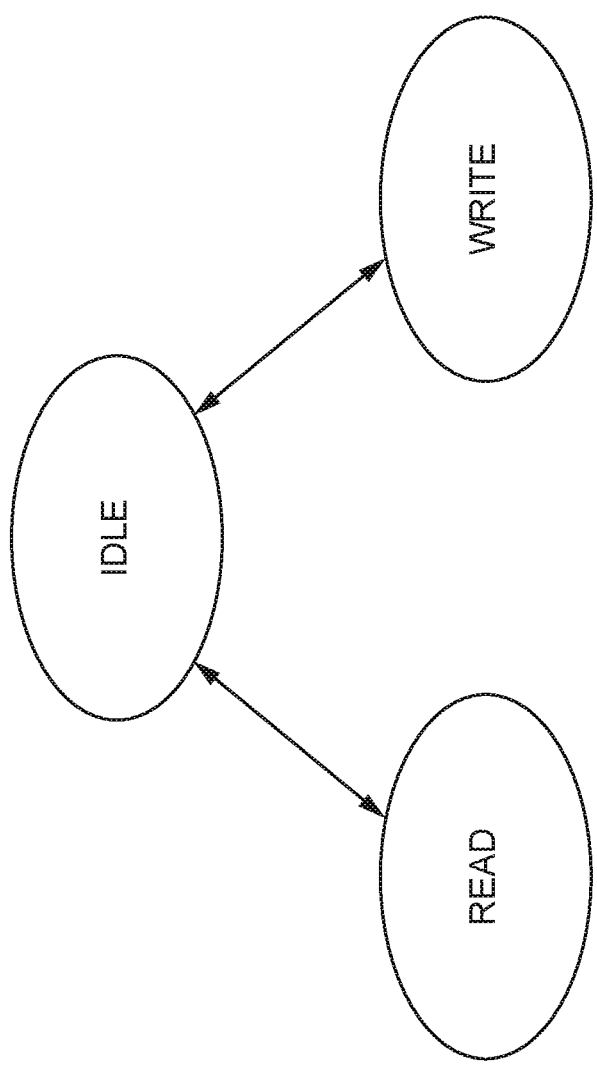
FIG. 2 is a diagram illustrating a state transition of the semiconductor device according to the present disclosure.

The command address signal CA includes a command and an address. The state of the semiconductor device 10 is defined by the command. As shown in FIG. 2, when a read command is issued while the semiconductor device 10 is in an IDLE state, the semiconductor device 10 transitions to a READ state. The semiconductor device 10 returns to the IDLE state when the read operation ends. Meanwhile, when a write command is issued while the semiconductor device 10 is in the IDLE state, the semiconductor device 10 transitions to a WRITE state. The semiconductor device 10 returns to the IDLE state when the write operation ends. In this way, because the ACT command used in a general-purpose DRAM is not used in the semiconductor device 10 according to the present embodiment, whether to perform a read operation or a write operation is determined by a command issued in the IDLE state.

Figure 3:
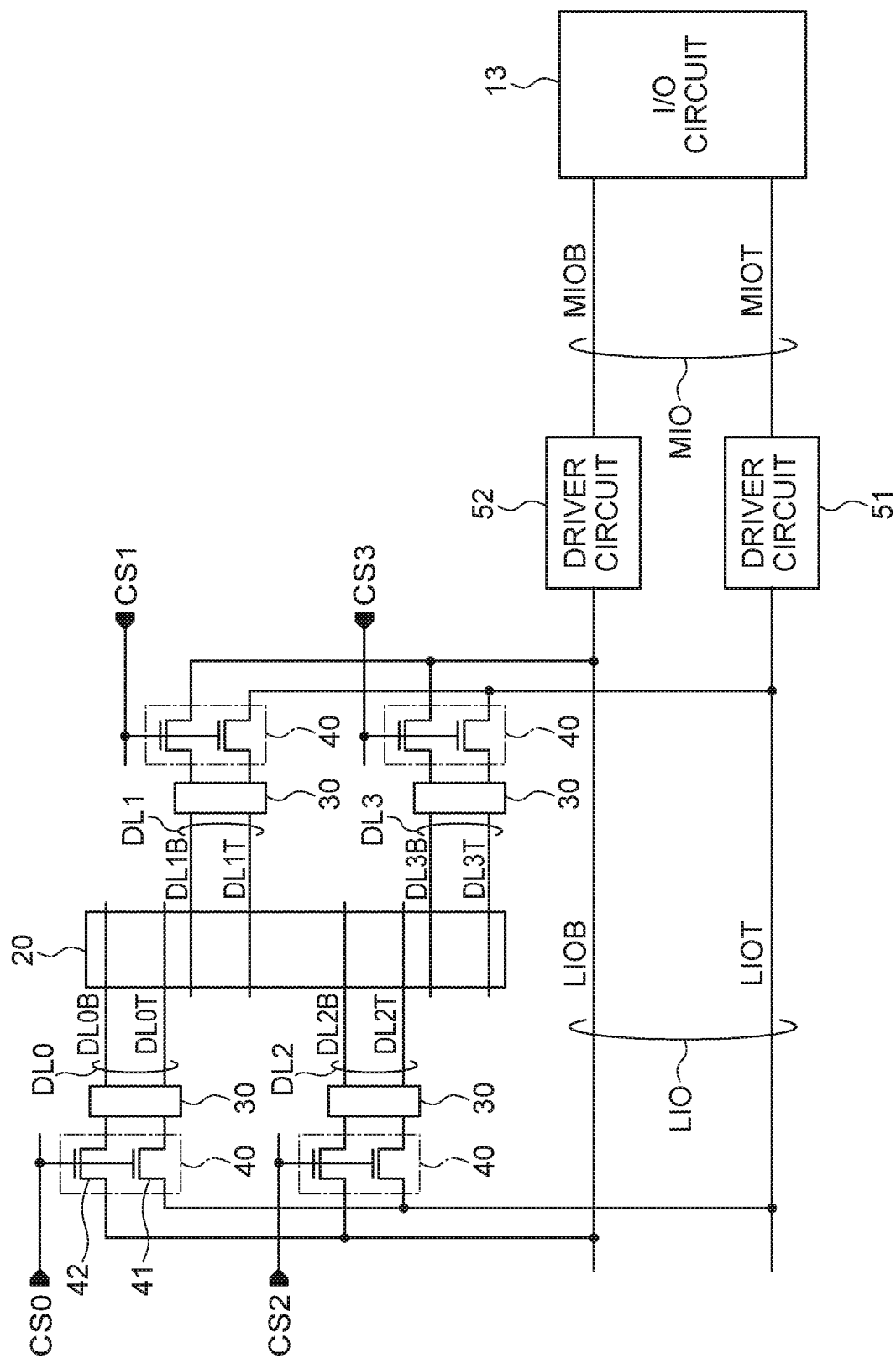
FIG. 3 is a circuit diagram illustrating a configuration of a main part of the semiconductor device according to the present disclosure.

The memory cell array 11 includes a plurality of memory banks 20 shown in FIG. 3. A plurality of digit line pairs DL0, DL1, DL2, DL3, . . . are provided in each of the memory banks 20. The digit line pair DL0 is composed of complementary digit lines DL0T and DL0B, the digit line pair DL1 is composed of complementary digit lines DL1T and DL1B, the digit line pair DL2 is composed of complementary digit lines DL2T and DL2B, and the digit line pair DL3 is composed of complementary digit lines DL3T and DL3B. The digit line pairs DL are connected to corresponding sense amplifiers 30, respectively. Further, the digit line pairs DL are connected to a local I/O line pair LIO via corresponding column switches 40, respectively. Each of the column switches 40 includes N-channel MOS transistors 41 and 42. The transistors 41 are connected between one local I/O line LIOT and the digit lines DL0T, DL1T, DL2T, DL3T, . . . , respectively. The transistors 42 are connected between the other local I/O line LIOB and the other digit lines DL0B, DL1B, DL2B, DL3B, . . . , respectively. The column swatches 40 are supplied with corresponding column selection signals CS, respectively. Specifically, column selection signals CS0, CS1, CS2, and CS3 are supplied to the column switches 40 corresponding to the digit line pairs DL0, DL1, DL2, and DL3, respectively. Column selection signals CS assigned to a same local I/O line pair are exclusively activated.

The local I/O line pair LIO is connected to the I/O circuit 13 via a main I/O line pair MIO. The main I/O line pair MIO is composed of complementary main I/O lines MIOT and MIOB. At the time of a read operation, read data that is read from the memory bank 20 is transferred to the I/O circuit 13 via the local I/O line pair LIO and the main I/O line pair MIO. At the time of a write operation, write data that is supplied from outside to the I/O circuit 13 is transferred to the local I/O line pair LIO via the main I/O line pair MIO. A driver circuit 31 is placed between the main I/O line MIOT and the local I/O line LIOT, and a driver circuit 32 is placed between the main I/O line MIOB and the local I/O line LIOB. The driver circuits 31 and 32 function to drive the local I/O line pair LIO at the time of a write operation. At the time of a write operation, there are a case in which data latched in the sense amplifiers 30 is inverted and a case in which the data is not inverted.

Figure 4:
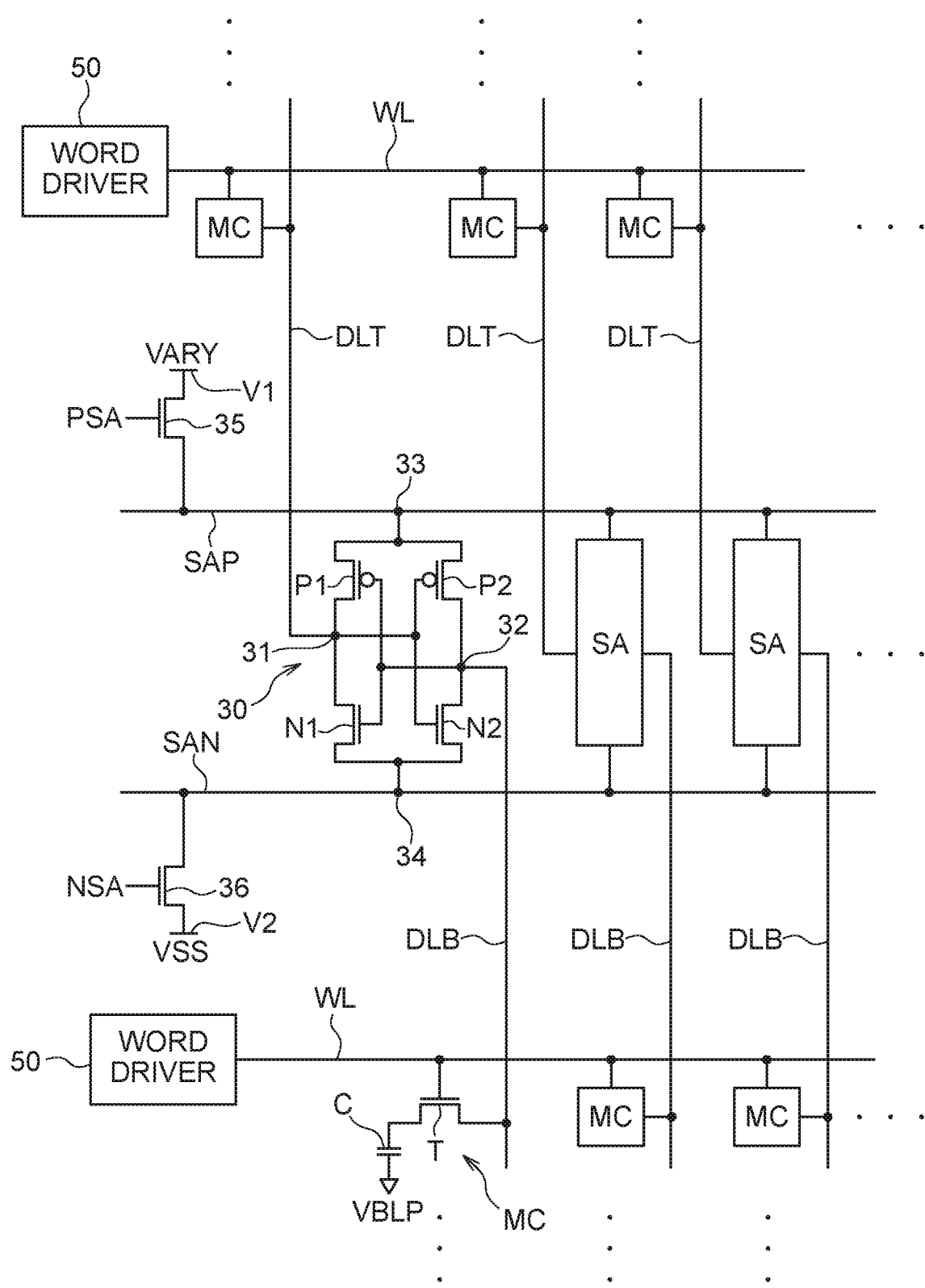
FIG. 4 is a circuit diagram of sense amplifiers and the vicinity thereof.

As shown in FIG. 4, each of the sense amplifiers 30 includes cross-coupled P-channel MOS transistors P1 and P2, and cross-coupled N-channel MOS transistors N1 and N2. Drains of fee transistors P1 and N1 constitute a first data node 31 and are connected to the corresponding digit line DLT. Drains of the transistors P2 and N2 constitute a second data node 32 and are connected to fee corresponding digit line DLB. Sources of the transistors P1 and P2 constitute a first power node 33 and are connected to a common source line SAP. Sources of the transistors N1 and N2 constitute a second power node 34 and are connected to a common source line SAN. An N-channel MOS transistor 33 is connected between a power line V1 supplying an array potential VARY and fee common source line SAP. A sense signal PSA is supplied to a gate electrode of the transistor 33. An N-channel MOS transistor 36 is connected between a power line V2 supplying a ground potential VSS and the common source line SAN. A sense signal NSA is supplied to a gate electrode of the transistor 36. Accordingly, the cross-coupled transistors P1 and P2 are activated when the transistor 33 is turned on and the cross-coupled transistors N1 and N2 are activated when the transistor 36 is turned on.

Memory cells MC are connected to each of the digit lines DLT and DLB. Each of the memory cells MC has a configuration in which a cell transistor T and a cell capacitor C are connected in series. A gate electrode of the cell transistor T is connected to a corresponding word line WL and a source/drain of the cell transistor T is connected to a corresponding digital line DLT or DLB. The word lines WL are driven by a word driver 50.

An operation of the semiconductor device 10 according to the present embodiment is explained next.

Figure 5:
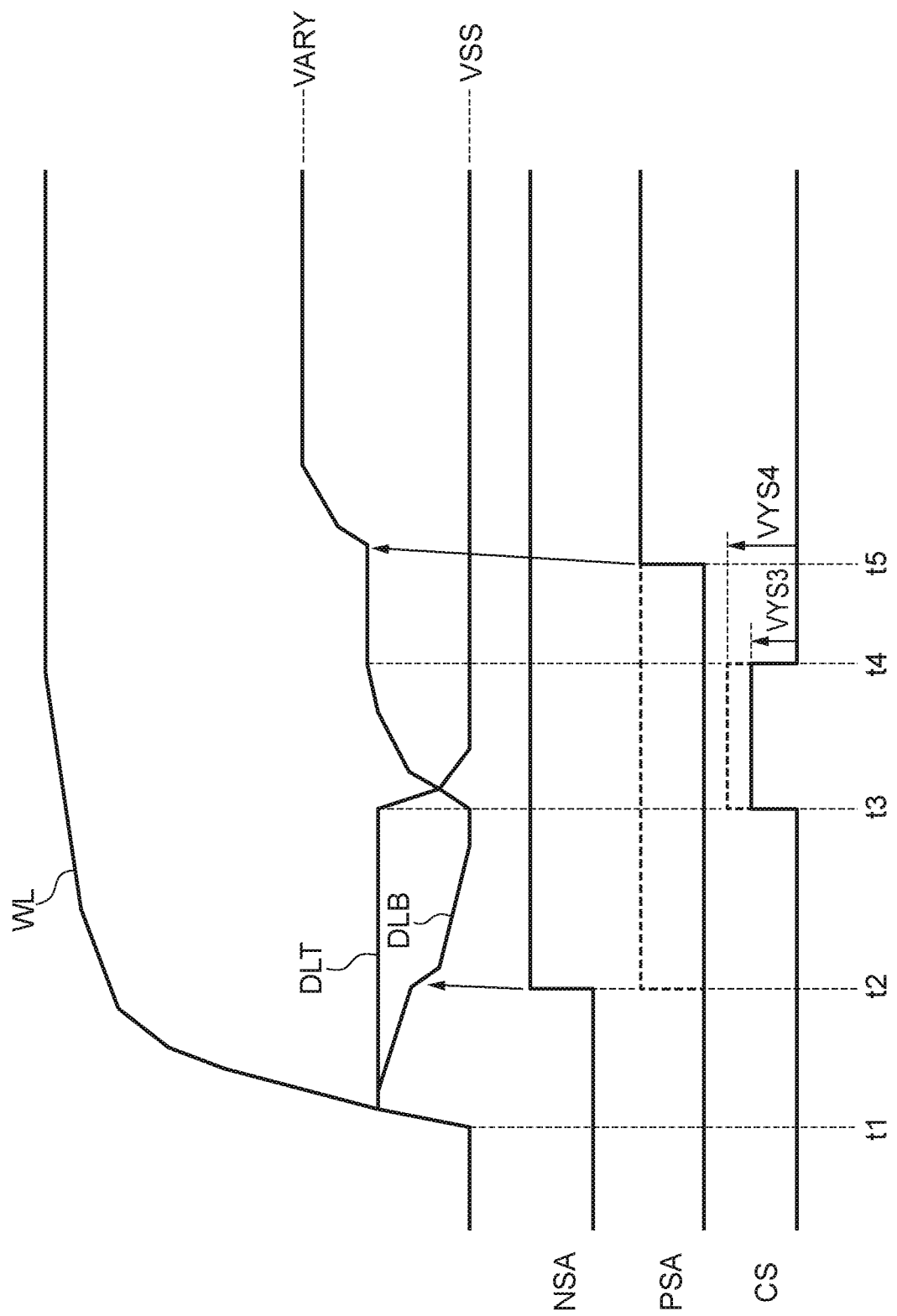
FIG. 5 is a waveform diagram for explaining an operation of the semiconductor device according to the present disclosure.

FIG. 5 is a waveform diagram for explaining a write operation of the semiconductor device 10. The write operation is performed by issuing a write command to the semiconductor device 10 in the idle state. When a write command is issued, a predetermined word line WL is driven at a time t1 on the basis of the address included in the command address signal CA. In response to the write command, an access control circuit, such as access control circuit 12 shown in FIG. 1, provides column select signals CS to column switches and further provides sense signals PSA and NSA to sense amplifiers of the memory cell array as previously described. FIG. 5 shows a case in which memory cells MC connected to the digit lines DLB are selected by the selected word line WL and data retained in the selected memory cells MC is at a low level. Accordingly, when the word line WL is driven at the time t1, the potential of the digit lines DLB gradually decreases. The potential of the digit lines DLT substantially does not change.

Next, the sense signal NSA is activated at a time t2. At this time, the sense signal PSA is kept in an inactive state. When the sense signal NSA is activated, the ground potential VSS is supplied to the common source line SAN and accordingly the cross-coupled transistors N1 and N2 are activated. Therefore, the potential of the digit lines DLB decreases more. However, because the sense signal PSA is in the inactive state at this time, the potential of the other digit lines DLT does not increase and accordingly the potential of the digit lines DLB gently decreases.

Next, the column selection signal CS is activated at a time t3. Also at this time, the sense signal PSA is kept in the inactive state. When the column selection signal CS is activated, the transistors 41 and 42 constituting the selected column switch 40 are turned on and therefore data latched in the corresponding sense amplifier 30 is rewritten with write data on the local I/O line pair LIO. FIG. 5 shows an example in which the local I/O line LIOT is at a low level and the local I/O line LIOB is at a high level. Because the potential of the corresponding digit line DLT accordingly decreases and the potential of the corresponding digit line DLB increases, the data latched in the sense amplifier 30 is promptly inverted. At this time, the sense signal PSA is in the inactive state and therefore the potential of the digit line DLT promptly decreases without being affected by the transistor P1 in the sense amplifier 30. The potential of the digit line DLB at this stage is limited by the level of the column selection signal CS. That is, assuming that the level of the column selection signal CS is VYS3 and the threshold voltage of the transistors 41 and 42 constituting the column switch 40 is Vth, the potential of the digit line DLB is limited to VYS3−Vth. The level VYS3 is lower than the array potential VARY. That is, the level VYS3 is at a level between the ground potential VSS and the array potential VARY. The column selection signal CS returns to the inactive state at a time t4.

Next, the sense signal PSA is activated at a time t5. When the sense signal PSA is activated, the array potential VARY is supplied to the common source line SAP and therefore the cross-coupled transistors P1 and P2 are activated. Accordingly, the potential of the digit lines DLB increases to the array potential VARY. When the word line WL is thereafter reset, a series of the write operation is completed. As described above, at the time of a write operation, after a word line WL is activated the sense signal NSA, the column selection signal CS, and the sense signal PSA are activated in this order. Therefore, data latched in a relevant sense amplifier 30 can be easily inverted. Associated therewith, the level VYS3 of the column selection signal CS is enabled to be set at a lower level than the array potential VARY and reduction of current consumption can be achieved.

On the other hand at the time of a read operation, the sense signals NSA and PSA are both activated at the time t2 as indicated by a dashed line in FIG. 5. Accordingly, all the transistors P1, P2, N1, and N2 in the sense amplifiers 30 are activated and the sense amplifiers 30 drive one of the digit lines DLT and DLB to the array potential VARY and the other thereof to the ground potential VSS. When the column selection signal CS is thereafter activated at the time t3, data on the relevant digit line pair DLT and DLB is transferred to the local I/O line pair LIO. In order to reduce transfer loss at this time, it is preferable to set the level VYS4 of the column selection signal CS to a higher potential than VYS3 and it is more preferable to set the level VYS4 to a higher potential than the array potential VARY.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method comprising:
   operating, by a sense amplifier, on first and second power potentials and amplifying, by the sense amplifier, a potential difference between first and second digit lines, the sense amplifier having a first power node supplied with the first power potential, and a second power node supplied with the second power potential, the sense amplifier comprising one or more P-MOS transistors and one or more N-MOS transistors, a first source of at least one of the one or more P-MOS transistors coupled to the first power node, and a second source of at least one of the one or more N-MOS transistors coupled to the second power node;

supplying, by a first transistor, the first power potential, the first transistor coupled to the sense amplifier via the first power node;

supplying, by a second transistor, the second power potential, the second transistor coupled to the sense amplifier via the second power node;

driving, by a driver circuit, each of the first and second digit lines to different one of first and second logic levels from each other, wherein in response to a first command, providing, by a control circuit, an active first sense signal to the first transistor, providing an inactive second sense signal to the second transistor, and providing an inactive column select signal to third and fourth transistors to activate the first transistor to an ON state while the second transistor is in an OFF state and to provide the inactive column select signal before the third and fourth transistors are activated to an ON state, and providing, by the control circuit, an active column select signal to the third and fourth transistors and then providing an active second sense signal to the second transistor to activate the second transistor to an ON state after the third and fourth transistors are activated to an ON state.

2. The method of claim 1, wherein the first command is a write command.

3. The method of claim 1, bringing, by the control circuit, the first and second transistors into an ON state before the third and fourth transistors are brought into an ON state in response to a second command.

4. The method of claim 3, wherein the first and second transistors are substantially simultaneously brought into an ON state in response to the second command.

5. The method of claim 4,
supplying, by the control circuit, a third potential to control electrodes of the third and fourth transistors in response to the first command, and supplying a fourth potential to the control electrodes of the third and fourth transistors in response to the second command, and
wherein the third potential is lower than the fourth potential.

6. The method of claim 5,
wherein the second potential is higher than the first potential, and
wherein the third potential is lower than the second potential.

7. The method of claim 6, wherein the fourth potential is higher than the second potential.

8. The method of claim 5,
driving, by the sense amplifier, each of the first and second digit lines to different one of fourth and fifth potentials from each other, and
wherein the third potential is between the fourth and fifth potentials.

9. The method of claim 3, wherein the second command is a read command.

10. A method comprising:
activating a pull-down portion of a sense amplifier in response to being supplied with a first power potential via a first transistor coupled to the sense amplifier and activating a pull-up portion in response to being supplied with a second power potential via a second transistor coupled to the sense amplifier,
providing, by a control circuit, at a first time of a write operation, a first sense signal to the sense amplifier to control the sense amplifier to amplify data by activating the pull-down portion with supplying the first power potential with the first sense signal and inactivating the pull-up portion without supplying the second power potential with a second sense signal; and
overwriting, by the control circuit, at a second time of the write operation following the first time of the write operation, data in the sense amplifier with activating the pull-down portion and inactivating the pull-up portion.

11. The method of claim 10, further comprising:
activating, by the control circuit, at a third time of the write operation following the second time of the write operation, the pull-up portion with supplying the second power potential.

12. The method of claim 10, further comprising:
controlling, by the control circuit, in a read operation, the sense amplifier to amplify data by activating both the pull-up portion and pull-down portion substantially at the same time.

13. The method of claim 10, wherein a first transistor is between the pull-down portion of the sense amplifier and a first voltage node supplied with the first power potential, and a second transistor is between the pull-up portion of the sense amplifier and a second voltage node supplied with the second power potential.

14. The method of claim 13, further comprising:
bringing, by the control circuit, in the first time of the write operation, the first transistor into an ON state while the second transistor is kept into an OFF state.

* * * * *